United States Patent
Lin et al.

(10) Patent No.: US 8,861,303 B2
(45) Date of Patent: Oct. 14, 2014

(54) CIRCUIT AND METHOD FOR ADDRESS TRANSITION DETECTION

(75) Inventors: Yung Feng Lin, Dasi Township, Taoyuan County (TW); Taifeng Chen, Jiang Shu Province (CN)

(73) Assignee: Macronix International Co., Ltd., Hsinchu (TW)

( * ) Notice: Subject to any disclaimer, the term of this patent is extended or adjusted under 35 U.S.C. 154(b) by 362 days.

(21) Appl. No.: 13/456,815

(22) Filed: Apr. 26, 2012

(65) Prior Publication Data
US 2013/0286764 A1 Oct. 31, 2013

(51) Int. Cl.
*G11C 8/00* (2006.01)
(52) U.S. Cl.
USPC ............... 365/230.08; 365/233.5; 365/241
(58) Field of Classification Search
USPC .................. 365/230.08, 233.5, 241
See application file for complete search history.

(56) References Cited

U.S. PATENT DOCUMENTS

| 5,875,152 | A | 2/1999 | Liu et al. |
| 6,747,909 | B2 * | 6/2004 | Kang .................. 365/233.5 |
| 6,980,481 | B1 * | 12/2005 | Brown ................ 365/233.5 |
| 7,227,811 | B2 * | 6/2007 | Cho .................... 365/233.5 |
| 7,911,872 | B2 * | 3/2011 | Lakhani et al. ...... 365/230.08 |

* cited by examiner

*Primary Examiner* — Toan Le
(74) *Attorney, Agent, or Firm* — Yiding Wu; Haynes Beffel & Wolfeld LLP

(57) ABSTRACT

A new address transition detection (ATD) circuit for use on an address bus having a plurality of address signal lines comprises a first circuit for each address signal line and a second circuit. The first circuit has a first input, a second input and an output. The first input is coupled to an address signal line. The second input is coupled to an ATD signal. The first circuit saves the current level of the first input in response to an ATD pulse on the ATD signal and generates a change signal at its output by comparing the current level and the saved level of the first input. The second circuit has an input and an output. The second circuit receives on its input the change signal from the first circuit. In response, the second circuit generates the ATD pulse on the ATD signal at its output.

20 Claims, 7 Drawing Sheets

CIRCUIT AND METHOD FOR ADDRESS TRANSITION DETECTION

FIELD OF THE INVENTION

The present invention relates to digital circuits and more particularly to Address Transition Detection (ATD) circuits.

BACKGROUND OF THE INVENTION

An address transition detection circuit for use on an address bus having any number of addresses is disclosed in U.S. Pat. No. 5,875,152, issued on Feb. 23, 1999, and entitled "Address Transition Detection Circuit for a Semiconductor Memory Capable of Detecting Narrowly Spaced Address Changes." This patent discloses a circuit that provides an ATD circuit which detects each address transition and provides an ATD circuit suitable for use with memories having address buses with a large number of addresses. As shown in FIG. 1, an edge detect unit 100 in the prior art comprises a minimum delay unit 106 and a comparator 108. Minimum delay unit 106 outputs the AIs (Input Address signal) in delayed form to comparator 108. Comparator 108 detects an address transition by responding to both the original AIs and the delayed AIs on its inputs. In the prior art, a minimum delay unit 106 is required for each address in a plurality of addresses. Accordingly, the circuit requires a large area on the chip for all the minimum delay units.

What is needed is an address transition detection circuit that does not use the minimum delay unit required for each address line, as in the prior art, and thereby can save a area in the layout of the integrated circuit.

SUMMARY

A circuit for detecting transitions in a signal, or a set of signals, commonly an address bus that is composed of many single address signal lines, is described. In the context of detecting transitions of an address signal, an address transition detection (ATD) circuit is described, for use on an address bus for a plurality of address signal lines. The detection of an address transition, or transitions of other signals, can be used to trigger operations such as a read flow in a memory circuit. The new signal transition detection circuit can be laid out in a small area on an integrated circuit.

DETAILED DESCRIPTION

A signal transition detection circuit usable for detection of address transitions on a plurality of address signal lines in a memory device is described. The circuit can be applied to detect transitions in other signals, such as a chip select control signal, or a chip enable control signal, as well.

Figure 1:
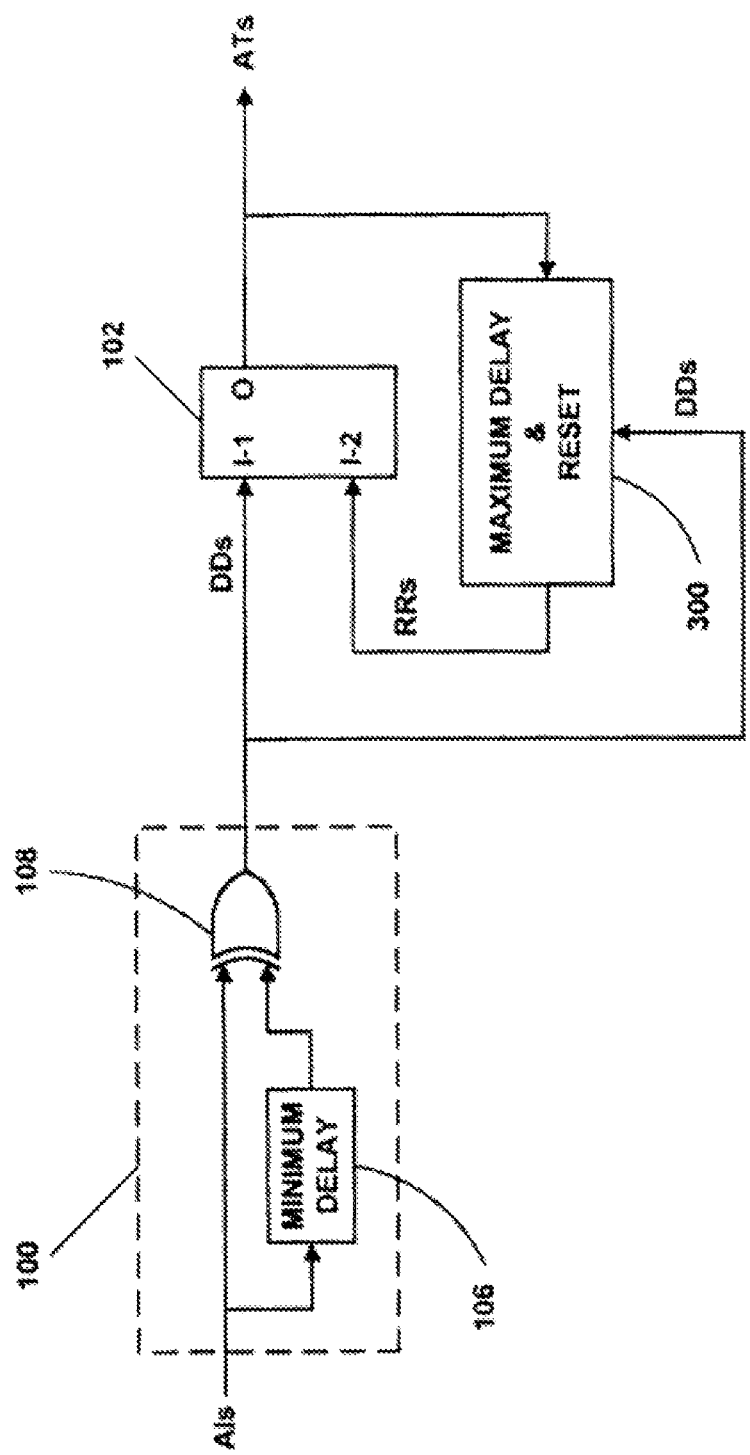
FIG. 1 depicts a prior art address transition detection circuit.
Figure 2:
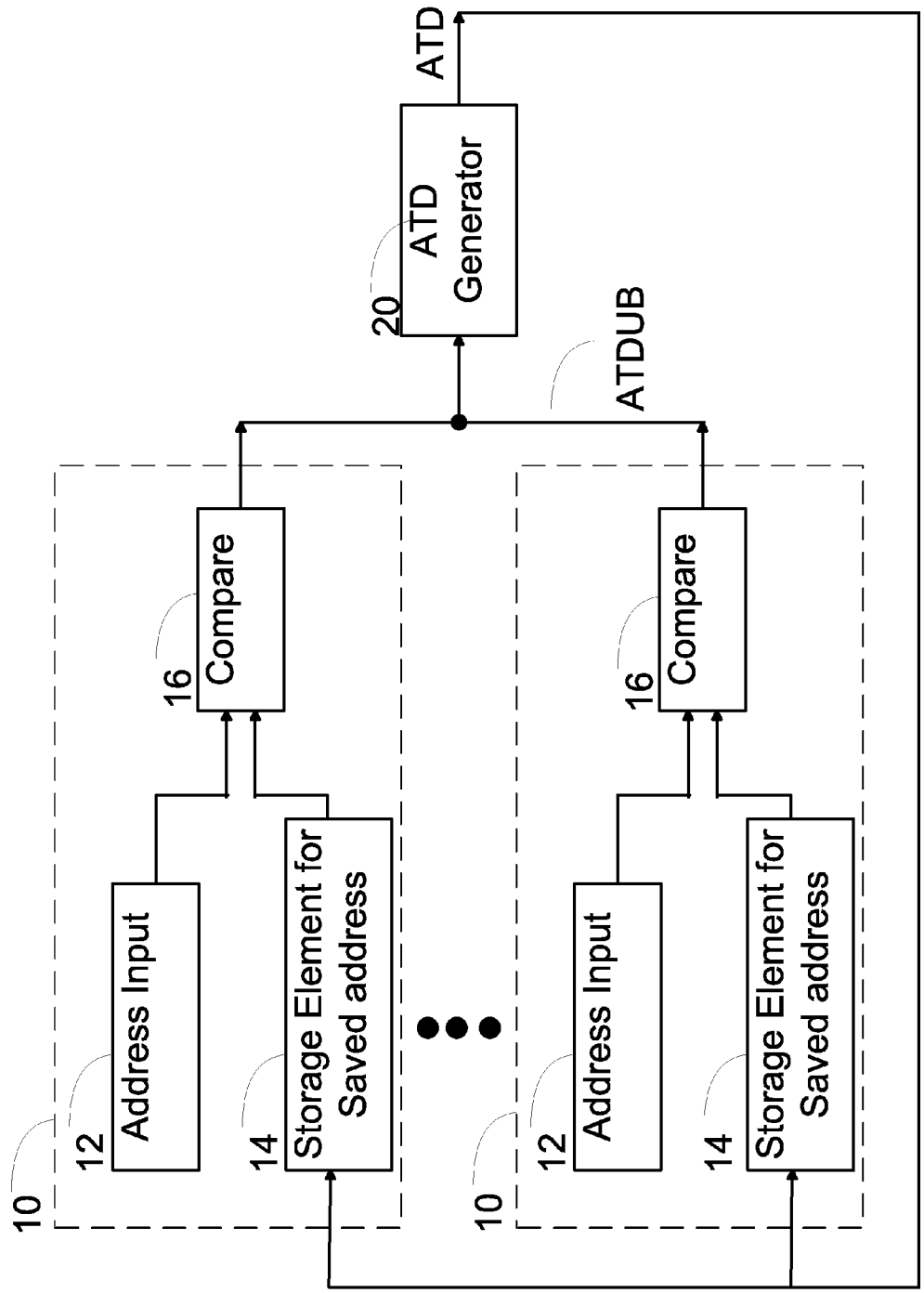
FIG. 2 depicts a block diagram in accordance with the present invention.

FIG. 2 is a block diagram in accordance with the present invention. The block diagram comprises a plurality of first circuits 10 corresponding to the plurality of address signal lines, and an address transition detection (ATD) signal generator 20 (second circuit). Each first circuit 10 comprises a comparator 16 that compares an input address at an address input 12 and a saved address in a storage element 14. The address input 12 comprises a signal line for a corresponding address signal line, such as a signal line connected to an input pin of an integrated circuit, or a line connected to an address generator on an integrated circuit. For example, a memory chip in a 32-pin package has 19 address pins A0-A18, 8 input/output data pins Q0-Q7, a chip enable pin CE, a write enable pin WE, and an output enable pin OE. In accordance with the current invention, there is a separate first circuit 10 for each of the 19 address pins A0-A18. If the CE pin and the OE pins are active while the WE pin is not active, the data pins Q0-Q7 will display a set of 8-bit data stored at an address specified by the 19 address pins. If the CE pin and the WE pins are active while the OE pin is not active, data values at data pins Q0-Q7 will be stored at the address specified by the 19 address pins A0-A18. The memory chip may be coupled to a microprocessor which controls the operations of the memory chip such as read, write, erase, and standby.

Each first circuit 10 also comprises the storage element 14 that stores the input address from the address input 12 as the saved address in storage element 14. When a transition occurs from a previous input address to a new input address on the address input 12, the previous input address saved in storage element 14 is initially different from the new input address. After the storage element 14 has updated with the new input address at the address input 12, the saved address in storage element 14 becomes identical to the input address at the address input 12. Comparison results of all first circuits 10 may be combined to generate an ATDUB signal (change signal) via a wired-OR network to be described below.

The ATD signal generator 20 generates an ATD signal that feeds back to each first circuit 10. The ATD signal controls the updating of the storage elements 14 in the first circuits 10. In an example described here, if an address transition is detected by a comparator 16, the ATDUB signal triggers the ATD signal generator 20 to set the ATD signal and start an ATD pulse (detection pulse). When all the first circuits 10 are updated, the ATDUB signal triggers the ATD signal generator 20 to reset the ATD signal and end the ATD pulse. The ATD pulse thus generated can be used to trigger internal read flow or to perform other functions.

Figure 3:
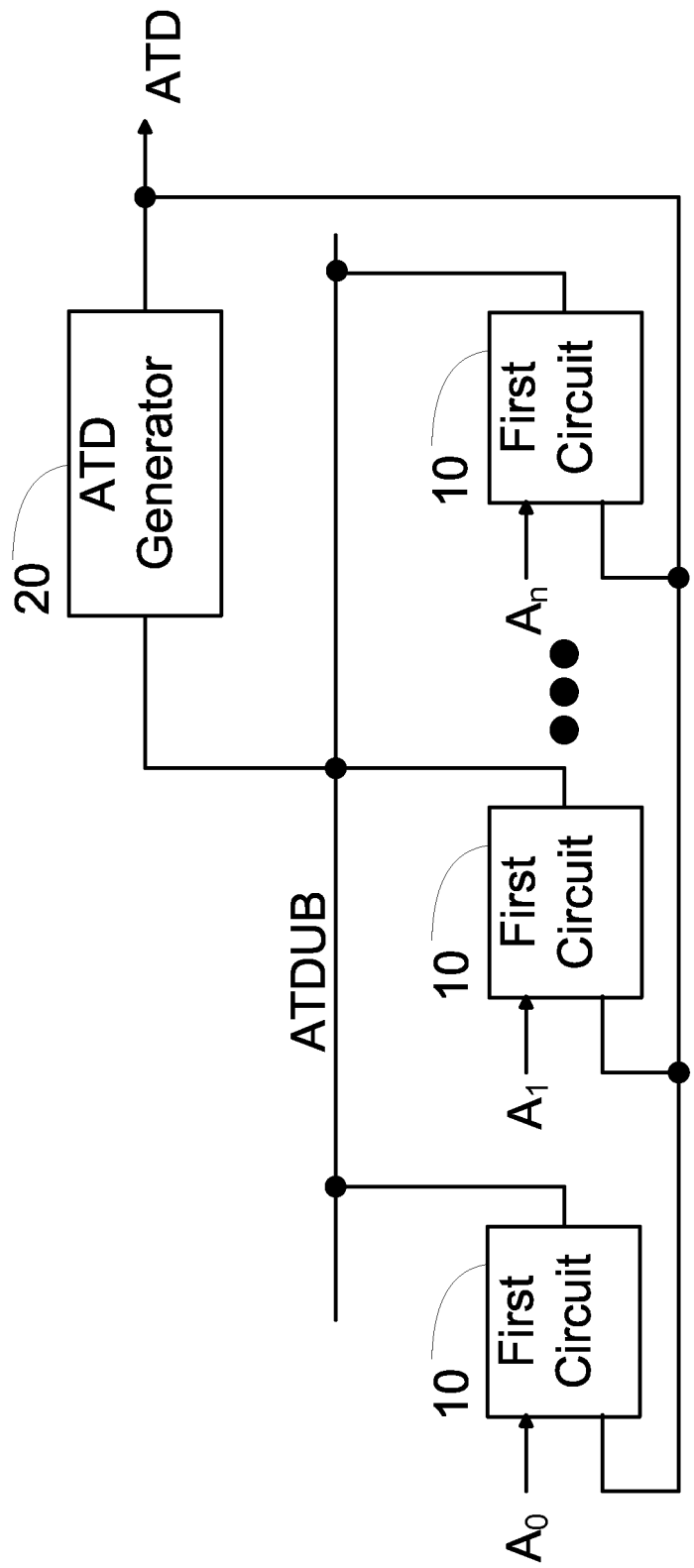
FIG. 3 depicts an address transition detection circuit arranged for detecting transitions in a plurality of address signal lines.

FIG. 3 illustrates an arrangement of an address transition detection (ATD) circuit with a self feedback loop for use with the plurality of address signal lines $A_0, A_1 \ldots A_n$ in accordance with the current invention. The circuit comprises the plurality of first circuits 10, the ATD signal generator 20 (second circuit), and the ATDUB signal coupled to both the first circuits 10, and the ATD signal generator 20. Each first circuit 10 includes an input, a second input, and an output. The ATD signal generator 20 has an input and an output. Each input of a first circuit 10 is connected to a separate address signal line in the plurality of address signal lines $A_0, A_1 \ldots A_n$. The ATDUB signal is connected to the output of each first circuit 10 and to the input of the ATD signal generator 20. The output of the ATD signal generator 20 is connected to the ATD signal. During operation, each address buffer compares an input address with a saved address. The ATDUB signal combines comparison results from all first circuits 10 on the signal to provide input for the ATD signal generator 20. The ATD signal generator 20 generates the ATD signal in response to the information on its input. The ATD signal feeds back to the second inputs of all first circuits 10.

Figure 4A:
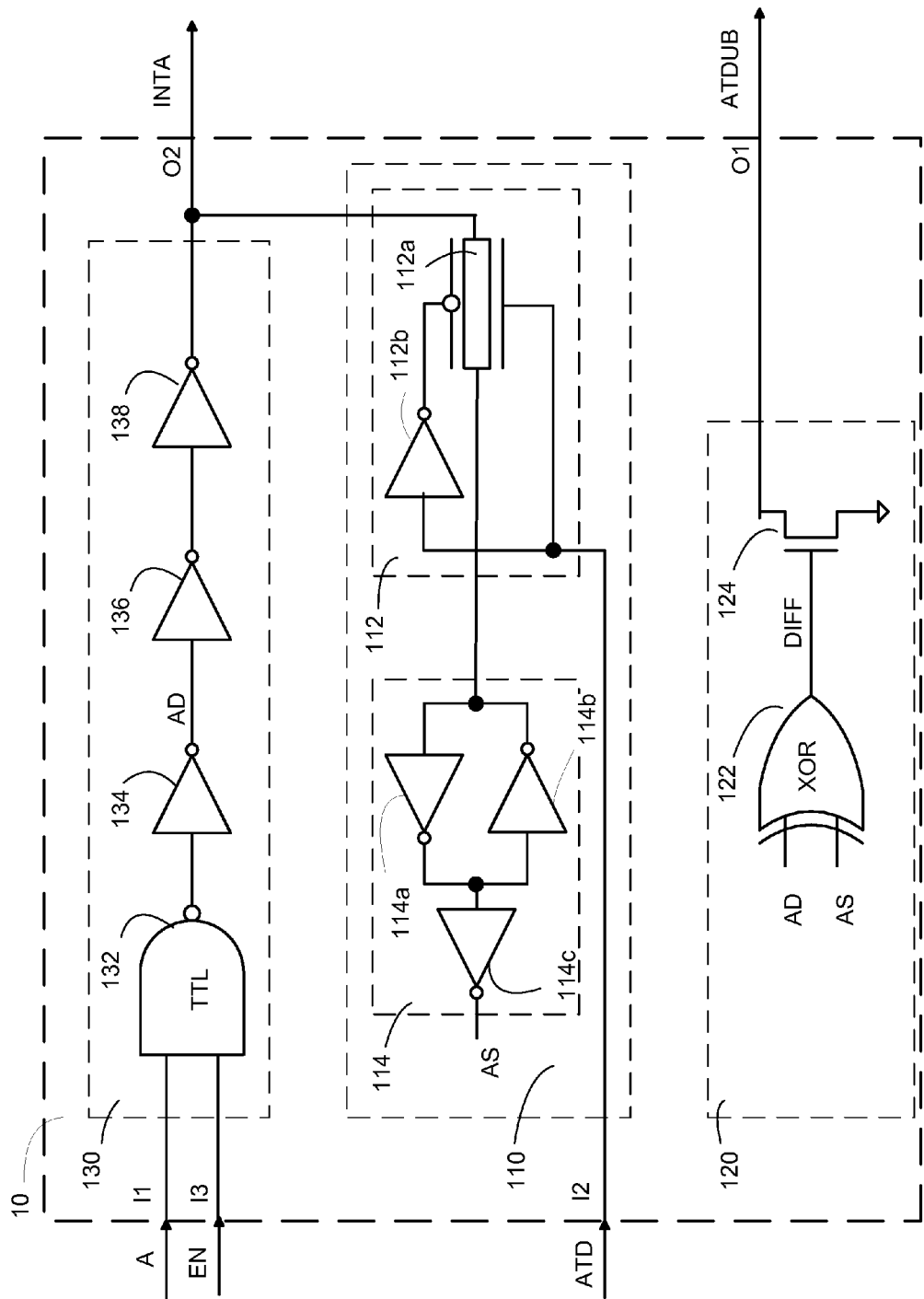
FIG. 4A is a detailed view of a circuit including a buffer, a storage element and a comparator suitable for use as the first circuit 10 shown in FIG. 2.

FIG. 4A illustrates an embodiment of the first circuit 10. The first circuit 10 includes an input I1, a second input I2, a third input I3, an output O1 and a second output O2. The input I1 of the first circuit 10 is coupled to an address signal line in the plurality of address signal lines $A_0, A_1 \ldots A_n$ as shown in FIG. 3. The second input I2 of the first circuit 10 is coupled to the ATD signal. The third input I3 of the first circuit 10 is coupled to an enable signal EN which can be coupled to a source internal or external to the memory device for enabling and disabling the ATD circuit, such as can be used for power saving purposes. As shown in FIG. 4A, EN is active high. Alternatively, EN may be active low. The output O1 of the first circuit 10 is coupled to the ATDUB signal. The second output O2 of the first circuit 10 is coupled to an INTA signal.

The first circuit 10 comprises a buffer 130, a storage element 110, and a comparator 120 for each address signal line. The buffer 130 comprises a NAND gate 132, having in this example TTL (transistor-transistor logic) signal level inputs, and three successive inverters 134, 136, and 138 in series. The NAND gate 132 has a first input, a second input and an output. Each inverter has an input and an output. In general, one or more inverters or buffers may be connected to the output of the NAND gate 132. Alternatively, instead of a NAND gate with two TTL signal level inputs, a signal level shifting logic gate such as a gate having CMOS (complementary metal-oxide-semiconductor) signal level inputs may be used with a different logic function such as an OR function, and/or with different number of inputs such as three inputs. The first input of the NAND gate 132 is connected to the input I1 of the first circuit 10. The second input of the NAND gate 132 is connected to the third input I3 of the first circuit 10. The output of the NAND gate 132 is connected to the input of inverter 134. The output of inverter 134 is connected to the input of inverter 136. The output of inverter 136 is connected to the input of inverter 138. The output of inverter 138 is connected to the second output O2 of the first circuit 10. Operatively, the buffer 130 comprises a first input coupled to the first input of the NAND gate 132, a second input coupled to the second input of the NAND gate 132, a first output coupled to an AD signal (input address), and a second output coupled to the output of inverter 138. The signal INTA at the output O2 carries a buffered input address signal line, when the circuit is enabled.

The storage element 110 has an input, a control input and an output. The storage element 110 comprises a transmission gate 112 and a latch 114. The transmission gate 112 may include an NMOS transistor, a PMOS transistor, or both an NMOS transistor and a PMOS transistor. Each NMOS or PMOS transistor includes a gate terminal. With any one of the transistor configurations, the transmission gate 112 comprises an input, a gate input and an output. The gate input of the transmission gate 112 is connected to the gate terminal of the NMOS transistor, the gate terminal of the PMOS transistor, or both the gate terminals of the NMOS and PMOS transistors. In one embodiment as shown in FIG. 4A, the input of the transmission gate 112 is connected to the output of the inverter 138, receiving the buffered input address signal line INTA. The gate terminal of the NMOS transistor in the transmission gate 112 is connected to the ATD signal. The gate terminal of the PMOS transistor in the transmission gate 112 is connected to an inverse of the ATD signal via an inverter 112b. Alternatively, the connection of the ATD signal to the NMOS node and the PMOS node of the transmission gate 112 may be reversed, depending on the polarity of the ATD signal.

In general, the signal ATD controls passing of the buffered input address signal line INTA to the latch 114. In the present embodiment, the signal INTA is passed via the transmission gate 112 to the latch 114 when the signal ATD is high.

The latch 114 comprises an input, an output, and three inverters 114a, 114b and 114c. Each inverter has an input and an output. The output of the transmission gate 112 is connected with the input of inverter 114a and the output of inverter 114b. The output of the inverter 114a is connected with the input of inverter 114b and the input of inverter 114c. Operatively, the input of the latch 114 is coupled with the input of inverter 114a. The signal INTA driven through the transmission gate causes the latch formed by the inverters 114a and 114b to store the input address INTA. The output of the latch 114 is coupled with the output of inverter 114c and provides the AS signal (saved address). Operatively, the input of the storage element 110 is coupled with the input of the transmission gate 112. The control input of the storage element 110 is coupled with the gate input of the transmission gate 112. The output of the storage element 110 is coupled with the output of the latch 114.

The comparator 120 comprises an XOR gate 122 and is coupled to a pull-down NMOS transistor 124 as shown in FIG. 4A. The XOR gate 122 has an input, a second input and an output. The comparator 120 has an input coupled to the input of XOR gate 122, a second input coupled to the second input of XOR gate 122, and an output coupled to the output of XOR gate 122. Alternatively, an XNOR gate may be used instead of the XOR gate. The pull-down NMOS transistor 124 has a gate, a drain terminal and a source terminal connected to a ground potential. The input of comparator 120 is connected to the AD signal from the output of inverter 134, which is coupled to the input address signal line, and the second input of comparator 120 is connected to the saved address AS signal from the storage element 110. The output of comparator 120 is connected to the gate of the pull-down NMOS transistor 124. Operatively, a DIFF signal is coupled with the output of comparator 120 and the gate of the pull-down NMOS transistor 124. The drain terminal of the pull-down NMOS transistor 124 is connected to the output O1 of the first circuit 10 and the ATDUB signal.

Figure 4B:
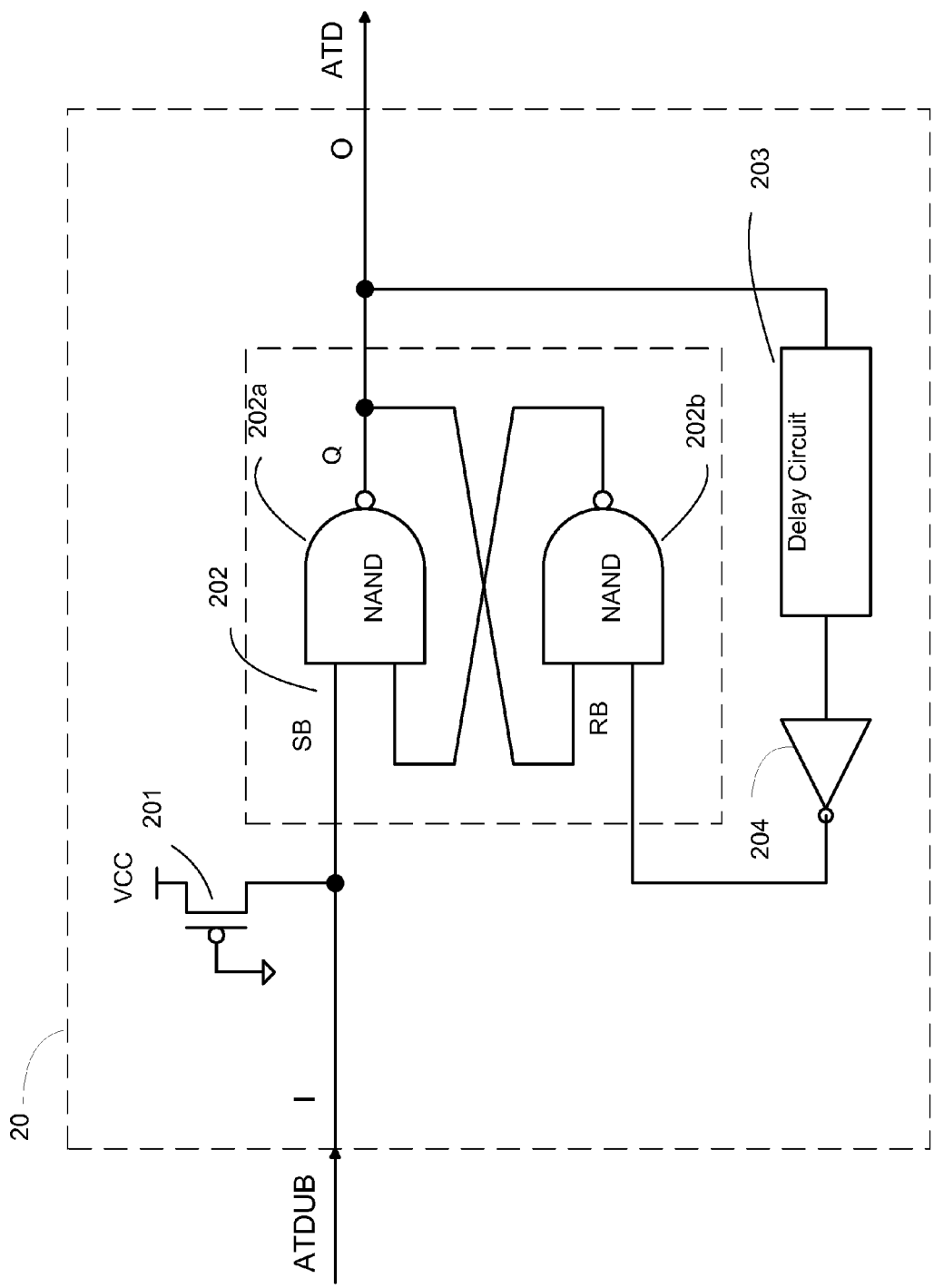
FIG. 4B is a detailed view of an address transition detection signal generator suitable for use in the circuit of FIG. 2.

The signal transition detection circuit includes a wired-OR network. The wired-OR network comprises a plurality of pull-down NMOS transistors 124 corresponding to a plurality of first circuits 10 and a pull-up PMOS transistor 201. Gates of the plurality of pull-down NMOS transistors 124 are connected to the outputs of corresponding comparators 120. Drain terminals of the plurality of pull-down NMOS transistors 124 are connected to an output of the wired-OR network and the ATDUB signal. Source terminals of the plurality of pull-down NMOS transistors 124 are connected to the ground potential. The pull-up PMOS transistor 201 is coupled to the ATDUB signal as shown in FIG. 4B and is described in detail below. The wired-OR network combines the outputs of the comparators 120 for the ATD signal generator 20.

FIG. 4B illustrates an embodiment of the ATD signal generator 20. The ATD signal generator 20 has an input I coupled to the ATDUB signal and an output O coupled to the ATD signal. The ATD signal generator 20 comprises a pull-up PMOS transistor 201, a set/reset latch 202, a delay circuit 203, and an inverter 204. The pull-up PMOS transistor 201 has a gate connected to a ground potential, a drain terminal connected to the input I of the ATD signal generator 20, and a source terminal connected to a voltage potential. The pull-up PMOS transistor 201 can be weak compared to the pull down transistors 124, so that any one of the pull down transistors 124 can pull the ATDUB signal below the trigger point of the set/reset latch 202. The set/reset latch 202 has a set input SB connected to the input I of the ATD signal generator 20, a reset input RB, and an output Q connected to the output O of the ATD signal generator 20. The delay circuit 203 has an input connected to the output Q of the set/reset latch 202 and an output. The inverter 204 has an input connected to the output of the delay circuit 203 and an output connected to the reset input RB of the set/reset latch 202.

The set/reset latch 202 comprises a NAND gate 202*a* and a NAND gate 202*b*. Each NAND gate has a first input, a second input and an output. The two NAND gates are cross coupled together. The output of the NAND gate 202*a* is connected to the first input of the NAND gate 202*b* while the output of the NAND gate 202*b* is connected to the second input of the NAND gate 202*a*. The first input of the NAND gate 202*a* is connected to the set input SB of the set/reset latch 202. The second input of the NAND gate 202*b* is connected to the reset input RB of the set/reset latch 202. Alternatively, the set/reset latch may be constructed with cross coupled NOR gates.

Referring to FIGS. 4A and 4B, during operation, the second input of the NAND gate 132 (FIG. 4A) is either at an active state or an inactive state. When the second input of the NAND gate 132 is at an inactive state, the first circuit 10 is disabled. When the second input of NAND gate 132 is at an active state, the first circuit 10 is enabled and the logic level of an address signal line at the input I1 of the first circuit 10 is passed through the buffer 130 to the output of inverter 134 which drives the AD signal and then to the output of the inverter 138 which drives the INTA signal.

The transmission gate 112 (FIG. 4A) is either on or off, as controlled by the ATD signal. When the ATD signal is at logic high or an active level, the transmission gate 112 is on, and it passes the logic level at its input to its output. Latch 114 consequently stores the logic level passed from the output of the transmission gate 112 and updates the AS signal at its output. When the ATD signal is at logic low or at an inactive level, the transmission gate 112 is off, the logic level is blocked from the input to the output of the transmission gate 112, and the logic level of the AS signal remains unchanged.

Responsive to both the AD signal at its input and to the AS signal at its second input, XOR gate 122 (FIG. 4A) outputs a logic level that indicates whether the logic levels at its two inputs are the same. If the logic levels at two inputs of XOR gate 122 are different, the DIFF signal at the output of XOR gate 122 is at logic high and the pull-down NMOS transistor 124 is turned on. Consequently the ATDUB signal is pulled down to logic low. If the two logic levels are the same, the DIFF signal is at logic low, and the pull-down NMOS transistor 124 is off.

When all the DIFF signals are at logic low in the plurality of first circuits 10 and accordingly all the pull-down NMOS transistors 124 in the plurality of first circuits 10 are off, the ATDUB signal is pulled up to logic high. When at least one of the DIFF signals is at logic high, the ATDUB signal is at logic low. Thereby the DIFF signals in the plurality of first circuits 10 are combined to produce the ATDUB signal.

During operation, the output Q of the set/reset latch 202 (FIG. 4B) transitions to logic high when its set input SB is at logic low. The output Q of the set/reset latch 202 transitions to logic low when its reset input RB is at logic low and its set input SB is at logic high. When an address transition is detected by one first circuit 10 among the plurality of first circuits 10, the ATDUB signal is pulled low and the ATD signal transitions to logic high and starts an ATD pulse on the ATD signal. Consequently, in each first circuit 10, the transmission gate 112 is turned on and the AS signal is updated. Once the AS signal is updated in an first circuit 10, the DIFF signal at the output of the XOR gate 122 in it transitions to logic low and the pull-down NMOS transistor 124 is turned off. The ATD signal stays at logic high as long as not all AS signals in the plurality of first circuits 10 are updated. When all AS signals have been updated and compared with the respective AD signals, the DIFF signals turn off the pull-down NMOS transistors 124 in the plurality of first circuits 10. Consequently, the ATDUB signal is pulled high by the pull-up PMOS transistor 201 in the ATD signal generator 20, and the ATD signal transitions to logic low and ends the ATD pulse. As described, the ATD pulse is a high pulse. Alternatively, it may be designed as a low pulse. The ATD pulse can be used to trigger internal read flow or to perform other functions.

The delay circuit 203 defines the minimum pulse width for the ATD pulse. If all saved addresses (as saved in storage elements 14 in FIG. 2 or the AS signal in FIG. 4A) are updated before the minimum pulse width, the ATD pulse is at least as long as the minimum pulse width. If it takes longer than the minimum pulse width to update all the saved addresses, the ATD signal stays high longer than the minimum pulse width until all the saved addresses are updated and thereby extending the ATD pulse width from the minimum pulse width defined by the delay circuit 203.

Figure 5:
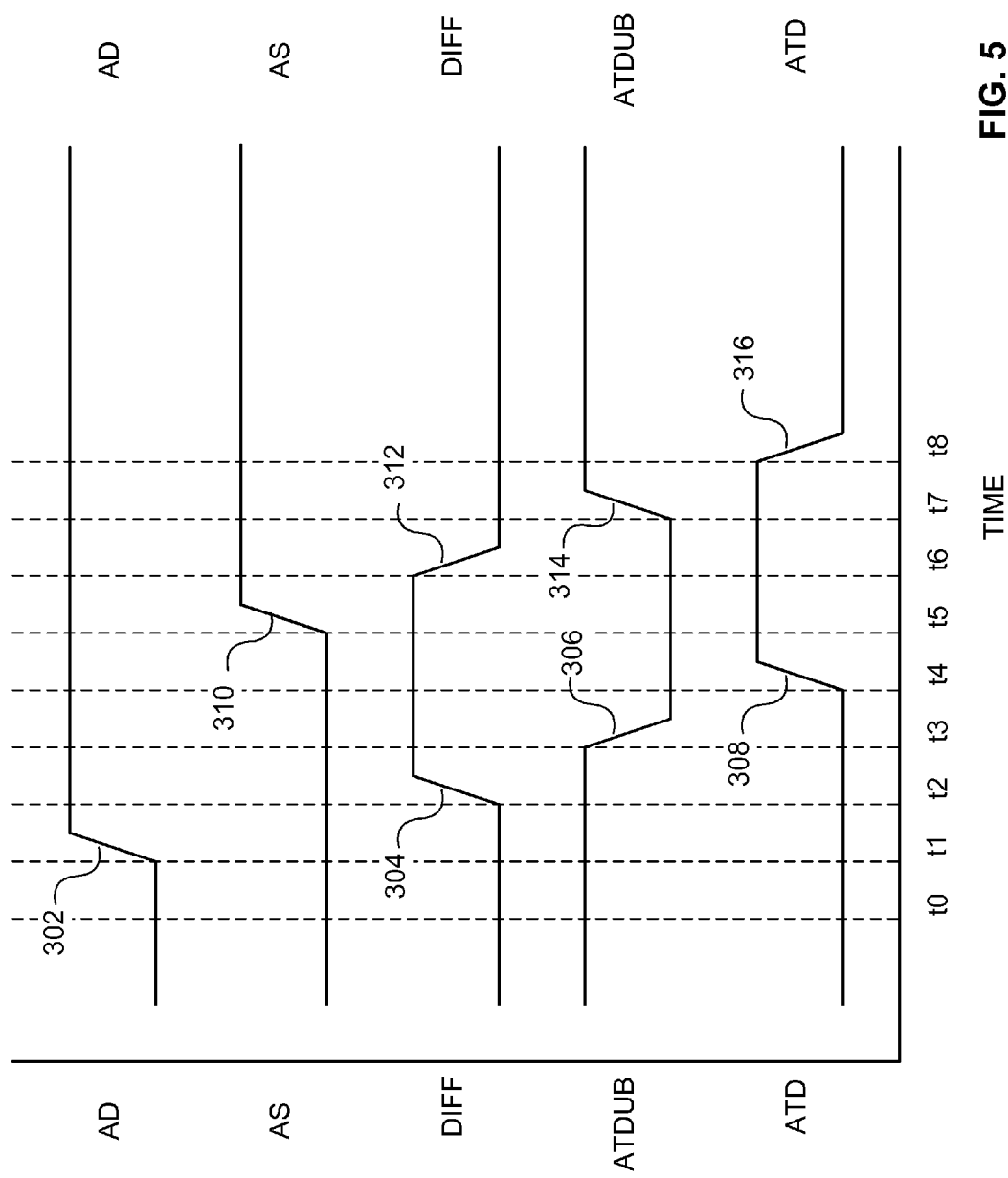
FIG. 5 is a timing diagram for a circuit as shown in FIG. 4A and FIG. 4B.

FIG. 5 illustrates an example of waveforms associated with the circuit of FIGS. 3, 4A and 4B. Waveforms for five signals are shown for one address transition: AD, AS, DIFF, ATDUB, and ATD. The AD signal is from the buffer 130 inside the first circuit 10 shown in FIG. 4A. The AS signal is from the storage element 110 inside the first circuit 10. The DIFF signal is from the comparator 120 inside the first circuit 10. The ATDUB signal sources the set input SB of the set/reset latch 202 shown in FIG. 4B. The ATD signal is generated by the set/reset latch 202 at its output Q. The reset input RB of the set/reset latch 202 is sourced by an inverted ATD signal with the delay circuit 203 inserted in-between as shown in FIG. 4B.

FIG. 5 shows how an ATD pulse is generated on the ATD signal by tracking the order in which edge transitions occur on signals involved. At time t0, both AD and AS are at logic low and accordingly the DIFF signal is at logic low indicating there is no difference between AD and AS. At time t1, AD transitions to logic high as indicated by rising edge 302. At time t2, AD and AS are different so the XOR gate 122 produces a rising edge 304 on the DIFF signal. At time t3, the DIFF signal turns on the pull-down NMOS transistor 124 and consequently pulls down the ATDUB signal as indicated by a falling edge 306. At time t4, the set/reset latch 202 is set by its set input SB at logic low to trigger a rising edge 308 on the ATD signal. The rising edge 308 starts the ATD pulse.

In response to the ATD pulse, at time t5, AS is updated to the level of AD as indicated by a rising edge 310. At time t6, both AD and AS are now at logic high and accordingly the DIFF signal produces a falling edge 312 to indicate there is no difference between AD and AS. At time t7, the low DIFF signal turns off the pull-down NMOS transistor and the ATDUB signal is pulled up with a rising edge 314. The waveforms shown here are for a single address signal line. When all pull-down NMOS transistors in the plurality of first circuits 10 are turned off, the ATDUB signal is pulled-up.

After the minimum pulse width defined in the delay circuit 203, the rising edge 308 on the ATD signal appears as a falling edge on the reset input RB of the set/reset latch 202. When the reset input RB is at logic low and the set input SB, which is coupled to the ATDUB signal, is at logic high, the set/reset latch 202 resets to trigger a falling edge 316 on the signal ATD at time t8. The falling edge 316 ends the ATD pulse.

Figure 6:
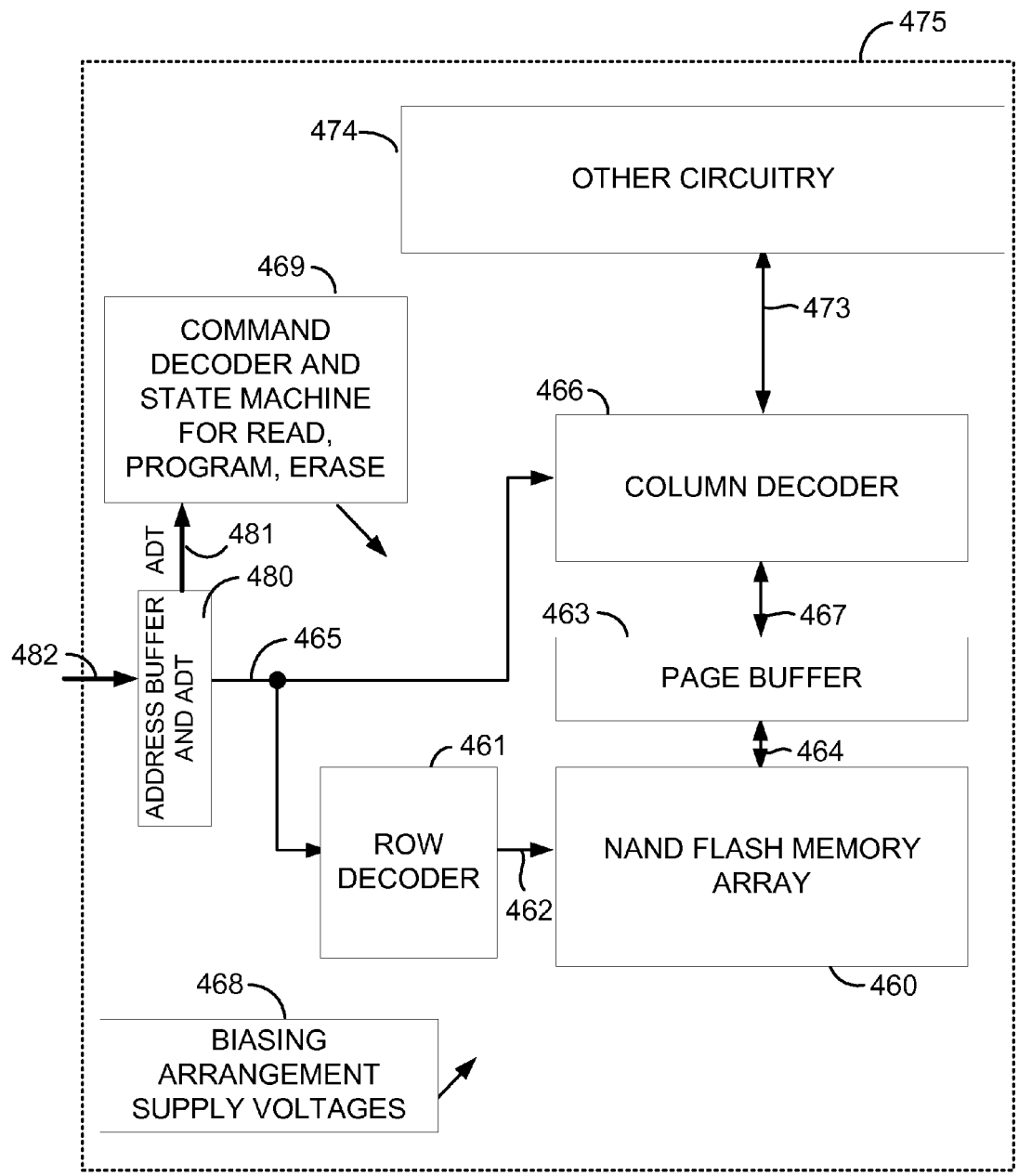
FIG. 6 is a block diagram of an integrated circuit memory employing an address transition detection circuit according to embodiments of the present invention.

FIG. 6 is a simplified block diagram of an integrated circuit 475 including a NAND flash memory array 460. In some embodiments, the array 460 can include multiple levels of cells. A row decoder 461 is coupled to a plurality of word lines 462 arranged along rows in the memory array 460. Column decoders in block 466 are coupled to a set of page buffers 463 in this example via data bus 467. The global bit lines 464 are coupled to local bit lines (not shown) arranged along columns in the memory array 460. Addresses are supplied from an input 482, such as multiple input pins on the circuit, to an address buffer and address transition detection circuit 480. The circuit 480 produces an ATD signal 481, which is applied to the control logic in block 469 to initiate each read, program or erase cycle when all address transitions are completed for the cycle. Also, from circuit 480, addresses are supplied on bus 465 to column decoder (block 466) and row decoder (block 461). Data is supplied via the data-in line 473 from other circuitry 474 (including for example input/output ports) on the integrated circuit, such as a general purpose processor or special purpose application circuitry, or a combination of modules providing system-on-a-chip functionality supported by the array 460. Data is supplied via the line 473 to input/output ports or to other data destinations internal or external to the integrated circuit 475.

A controller, implemented in this example as a command decoder and state machine 469, provides signals to control the application of bias arrangement supply voltages generated or provided through the voltage supply or supplies in block 468 to carry out the various operations described herein. These operations include read, program and operations, which can be responsive to the ATD signal. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The foregoing description of an embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A signal transition detection circuit to detect changes in a subject signal comprising:
    a first circuit having an input adapted to receive a subject signal which stores at a first time, a saved value of the subject signal, and produces an output in response to a comparison between a current value of the subject signal and the saved value; and
    a second circuit responsive to the output of the first circuit to generate a detection pulse,
    wherein the first circuit is responsive to the detection pulse, to replace the saved value with the current value of the subject signal.

2. The signal transition detection circuit of claim 1, further comprising:
    a plurality of first circuits, including the first circuit, each having an input adapted to receive a corresponding subject signal which stores at a first time, a saved value of a corresponding subject signal, and produces a corresponding output in response to a comparison between a current value of the corresponding subject signal and the saved value; and
    wherein the second circuit is responsive to the outputs of the plurality of first circuits to generate the detection pulse.

3. The signal transition detection circuit of claim 2, wherein each of the first circuits comprises:
    a buffer connected to the input, and responsive to an enable signal, to pass a signal level of the subject signal from the input to a first output; and
    a storage element having an input coupled to the first output of the buffer, the storage element storing a signal level from the input in response to the detection pulse, as the saved value.

4. The signal transition detection circuit of claim 3, wherein each of the first circuits further comprises:
    a comparator having an input coupled to the buffer, a second input coupled to the storage element and an output, and responsive to subject signal and the saved signal to provide a difference signal at the output of each of the first circuits.

5. The signal transition detection circuit of claim 2, including:
    a circuit combining the outputs of the plurality of first circuits to produce a combined transition signal, and to apply the combined transition signal to the second circuit.

6. The signal transition detection circuit of claim 5, wherein the second circuit comprises:
    a set/reset latch comprising a set input, a reset input and an output, the set input coupled to the combined transition signal; and
    a delay circuit having an input coupled to the output of the set/reset latch, and an output coupled to the reset input of the set/reset latch, the delay circuit thereby imposing a minimum pulse width for the detection pulse.

7. An address transition detection circuit to detect changes in a plurality of address signal lines for an integrated circuit including memory comprising:
    a source of addresses for the memory having a plurality of address signal lines;
    for each address signal line, a buffer, a storage element and a comparator, the buffer driving an address signal line from a corresponding address signal line to an input of the comparator, and to an input of the storage element, the storage element having an output coupled to a second input of the comparator, and a control input, arranged to store the corresponding address signal line in response to a signal on the control input, the comparator generating an output indicating a difference between the corresponding address signal line and the output of the storage element; and
    an address transition detection (ATD) signal generator comprising an input and an output, the input connected to the comparators for each address signal line, which produces an address transition detection (ATD) pulse on an ATD signal in response to the outputs of the comparators.

8. The address transition detection circuit of claim 7, wherein each of the buffers comprises:
    a gate comprising a first input connected to the corresponding address signal line, and a second input connected to an enable signal, and
    one or more inverters connected to an output of the gate.

9. The address transition detection circuit of claim 8, wherein the gate comprises a signal level shifting logic gate.

10. The address transition detection circuit of claim 7, wherein the storage element comprises a latch, and a transmission gate comprising an input, a gate input and an output, the input of the transmission gate connected to the buffer, the gate input of the transmission gate connected to the ATD signal, to control passing of the corresponding address signal line to the latch.

11. The address transition detection circuit of claim 7, wherein the comparators comprise respective XOR gates.

12. The address transition circuit of claim 7, including a wired-OR network coupling the outputs of the comparators to the input of the address transition detection (ATD) signal generator.

13. The address transition circuit of claim 12, wherein the wired-OR network includes:
a plurality of first MOS transistors coupled to the corresponding comparators, the first terminals of the first MOS transistors connected to an output of the wired-OR network, gates of the first MOS transistors connected to corresponding comparators, and second terminals of the first NMOS transistors connected to a first reference potential; and
a second MOS transistor coupled to the output of the wired-OR network, arranged to pull the output to a second reference potential unless one of the plurality of first MOS transistors is on.

14. The address transition detection circuit of claim 7, wherein the ATD signal generator comprises:
a set/reset latch having a set input, a reset input and an output, the set input of the set/reset latch coupled to the comparators, the output of the set/reset latch providing the ATD pulse; and
a delay circuit having an input connected to the output of the set/reset latch, an output coupled to the reset input of the set/reset latch, thereby defining a minimum pulse width for the ATD pulse.

15. A method for detecting transitions on a plurality of address signal lines, comprising:
latching address signal lines in the plurality of address signal lines to generate a corresponding plurality of saved address signal lines;
comparing the address signal lines in the plurality of address signal lines to corresponding saved address signal lines in the plurality of saved address signal lines to generate a corresponding plurality of difference signals; and
generating an address transition detection (ATD) pulse on an ATD signal at least partially in response to the plurality of difference signals.

16. The method of claim 15, wherein the latching comprises:
passing a signal level of an address signal line in the plurality of address signal lines to a storage element in response to the ATD pulse; and
storing the signal level of the address signal line in the storage element.

17. The method of claim 15, wherein the comparing comprises:
generating a corresponding difference signal in the plurality of difference signals in response to the address signal line and the saved address signal line;
wherein the difference signal is at a first difference signal level in response to different signal levels on the address signal line and the saved address signal line wherein the difference signal is at a second difference signal level in response to same signal levels on the address signal line and the saved address signal line;
wherein the first difference signal level is one of logic high and logic low; and wherein the second difference signal level is another one of logic high and logic low.

18. The method of claim 15, further comprising:
combining the plurality of difference signals into a change signal.

19. The method of claim 18, wherein the combining comprises
transitioning the change signal to a first change signal level in response to the first difference signal level on at least one difference signal in the plurality of difference signals; and
transitioning the change signal to a second change signal level in response to the second difference signal level on all difference signals in the plurality of difference signals.

20. The method of claim 19, wherein the generating an ATD pulse comprises:
setting a set/reset latch in response to the first change signal level on the change signal to trigger a first edge transition on the ATD signal to start the ATD pulse;
defining a minimum pulse width for the ATD pulse; and
resetting the set/reset latch after the minimum pulse width and in response to the second change signal level on the change signal to trigger a second edge transition on the ATD signal to end the ATD pulse.

* * * * *